(12) United States Patent
Chen et al.

(10) Patent No.: US 10,407,791 B2
(45) Date of Patent: Sep. 10, 2019

(54) SELECTIVE SOLDER PLATING

(71) Applicant: International Business Machines Corporation, Armonk, NY (US)

(72) Inventors: Qianwen Chen, Ossining, NY (US); Bing Dang, Chappaqua, NY (US); Yu Luo, Hopewell Junction, NY (US); Joana Sofia Branquinho Teresa Maria, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/851,846

(22) Filed: Dec. 22, 2017

(65) Prior Publication Data

US 2018/0135197 A1    May 17, 2018

Related U.S. Application Data

(62) Division of application No. 14/967,861, filed on Dec. 14, 2015.

(51) Int. Cl.
*C25D 5/02*  (2006.01)
*C25D 7/04*  (2006.01)
(Continued)

(52) U.S. Cl.
CPC ............... *C25D 7/04* (2013.01); *B23K 35/26* (2013.01); *B23K 35/262* (2013.01); *C25D 3/30* (2013.01);
(Continued)

(58) Field of Classification Search
None
See application file for complete search history.

(56) References Cited

U.S. PATENT DOCUMENTS 3,075,892 A * 1/1963 John .................... C25D 5/34
                                                     205/123
3,956,528 A  5/1976 Ugro
(Continued)

FOREIGN PATENT DOCUMENTS

CN    101752554   *  6/2010  .......... H01M 4/1395
JP    05074778    *  3/1993  ............... C25D 7/00

OTHER PUBLICATIONS

Topart et al., "Wafer-Level Vacuum Packaging Technology Based on Selective Electroplating", Micromachining and Microfabrication Process Technology IX, Proceedings of SPIE vol. 5342, downloaded from http://proceedings.spiedigitallibrary.org/ on Sep. 28, 2015.

(Continued)

*Primary Examiner* — Stefanie S Wittenberg
(74) *Attorney, Agent, or Firm* — Harrington & Smith

(57) ABSTRACT

A method provides a structure that includes a substrate having a metal layer disposed on a surface and a metal feature disposed on the metal layer. The method further includes immersing the structure in a plating bath contained in an electroplating cell, the plating bath containing a selected solder material; applying a voltage potential to the structure, where the structure functions as a working electrode in combination with a reference electrode and a counter electrode that are also immersed in the plating bath; and maintaining the voltage potential at a predetermined value to deposit the selected solder material selectively only on the metal feature and not on the metal layer. An apparatus configured to practice the method is also disclosed.

7 Claims, 3 Drawing Sheets

(51) Int. Cl.
*H01L 21/288* (2006.01)
*B23K 35/26* (2006.01)
*C25D 17/12* (2006.01)
*C25D 3/60* (2006.01)
*C25D 3/30* (2006.01)
*C25D 3/54* (2006.01)
*C25D 7/12* (2006.01)
*C25D 17/00* (2006.01)
*H01L 23/14* (2006.01)

(52) U.S. Cl.
CPC ............... *C25D 3/54* (2013.01); *C25D 3/60* (2013.01); *C25D 5/02* (2013.01); *C25D 7/123* (2013.01); *C25D 17/001* (2013.01); *C25D 17/12* (2013.01); *H01L 21/2885* (2013.01); *H01L 23/147* (2013.01)

(56) References Cited

U.S. PATENT DOCUMENTS

| | | | |
|---|---|---|---|
| 4,548,681 A | 10/1985 | Basol et al. | |
| 5,292,559 A | 3/1994 | Joyce, Jr. et al. | |
| 6,764,748 B1* | 7/2004 | Farquhar | B32B 27/36 174/250 |
| 6,828,660 B2 | 12/2004 | Abbott | |
| 7,364,063 B2 | 4/2008 | Schaenzer et al. | |
| 8,119,525 B2 | 2/2012 | Yu et al. | |
| 8,303,791 B2 | 11/2012 | Basker et al. | |
| 8,900,986 B2 | 12/2014 | Huang et al. | |
| 2002/0102869 A1* | 8/2002 | Ali | H05K 3/3436 439/66 |
| 2004/0245113 A1* | 12/2004 | Bokisa, Sr. | C25D 21/18 205/252 |
| 2006/0270229 A1 | 11/2006 | Corderman et al. | |
| 2008/0217181 A1* | 9/2008 | Hautier | C25D 3/54 205/77 |
| 2008/0217182 A1 | 9/2008 | Dai | |
| 2009/0004552 A1 | 1/2009 | Sun et al. | |
| 2009/0188808 A1 | 7/2009 | Wang et al. | |
| 2013/0273730 A1* | 10/2013 | Huang | C25D 5/10 438/613 |

OTHER PUBLICATIONS

List of IBM Patents or Patent Applications Treated As Related, Dec. 2017, 2 pgs.

Huang et al. "Electrodeposition of Indium on copper for CIS and CIGS solar cell applications", JES, 158, 2, D57-D61, 2011 (Year: 2011).

* cited by examiner

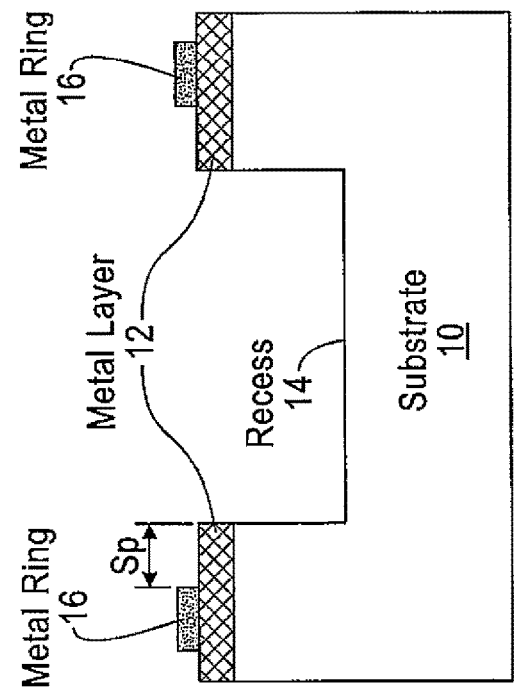
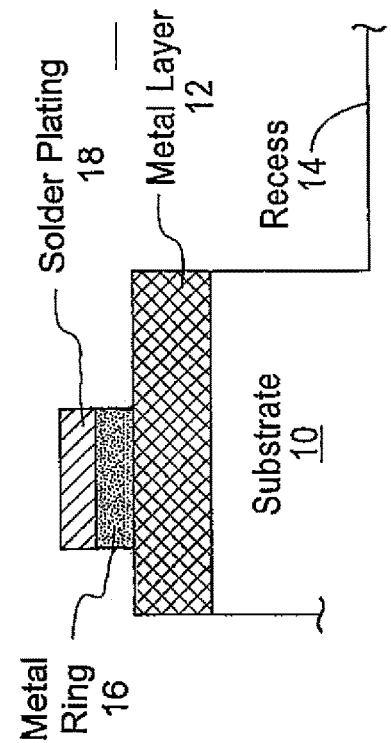
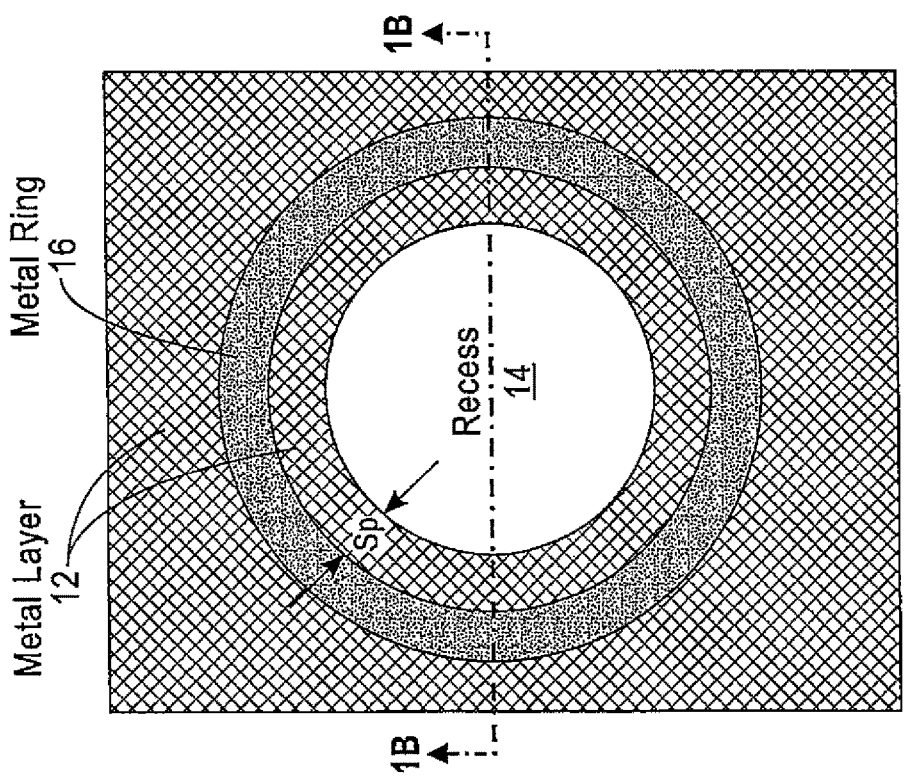
FIG. 1B
FIG. 1C
FIG. 1A

SELECTIVE SOLDER PLATING

CROSS REFERENCE TO RELATED APPLICATION

This patent application is a divisional application of copending U.S. patent application Ser. No. 14/967,861, filed on Dec. 14, 2015, the disclosure of which is incorporated by reference herein in its entirety.

TECHNICAL FIELD

The embodiments of this invention relate generally to soldering operations such as those used to create a seal and, more specifically, relate to soldering operations performed over a surface of a substrate containing apertures or voids (recessed structures) in the surface, or raised structures on the surface.

BACKGROUND

A seal made with low melting temperature solder can be beneficial for certain devices such as devices formed on or in a surface of a semiconductor wafer. However, solder alloys are typically not compatible with some typically used semiconductor wafer processing techniques such as plasma enhanced chemical vapor deposition (PECVD) and deep reactive ion etch (RIE) processes. In general it can be difficult to deposit and pattern photoresist on a substrate surface, so as to selectively apply a desired solder, after complex structures are fabricated on or in the substrate surface such as deep vias (recessed structures) and/or raised structures having a large topography.

SUMMARY

In a first aspect thereof the embodiments of this invention provide a method that comprises providing a structure comprised of a substrate having a metal layer disposed on a surface and a metal feature disposed on the metal layer; immersing the structure in a plating bath contained in an electroplating cell, the plating bath comprising a selected solder material; applying a voltage potential to the structure, where the structure functions as a working electrode in combination with a reference electrode and a counter electrode that are also immersed in the plating bath; and maintaining the voltage potential at a predetermined value to deposit the selected solder material selectively only on the metal feature and not on the metal layer.

In another aspect thereof the embodiments of this invention provide an apparatus that comprises a tank containing a plating bath of an electroplating cell, the plating bath comprising a selected solder material; a working electrode immersed in the plating bath, the working electrode comprised of a structure that comprises a semiconductor substrate having a metal layer disposed on a surface and a metal feature disposed on the metal layer; a reference electrode and a counter electrode immersed in the plating bath; and a power supply connected with a potentiostat configured to maintain a voltage potential of the working electrode at a predetermined constant value with respect to the reference electrode to deposit the selected solder material selectively only on the metal feature and not on the metal layer.

BRIEF DESCRIPTION OF THE SEVERAL VIEWS OF THE DRAWINGS

FIGS. 1A, 1B, and 1C, collectively referred to as FIG. 1, illustrate enlarged views of a structure wherein the various layer thicknesses and other dimensions are not necessarily drawn to scale. More specifically, FIG. 1A is a top view of the structure, FIG. 1B is a cross-sectional view taken along the section line labeled 1B-1B in FIG. 1A, and FIG. 1C is a further enlarged view of a portion of the structure shown in FIG. 1B.

DETAILED DESCRIPTION

Figure 2:
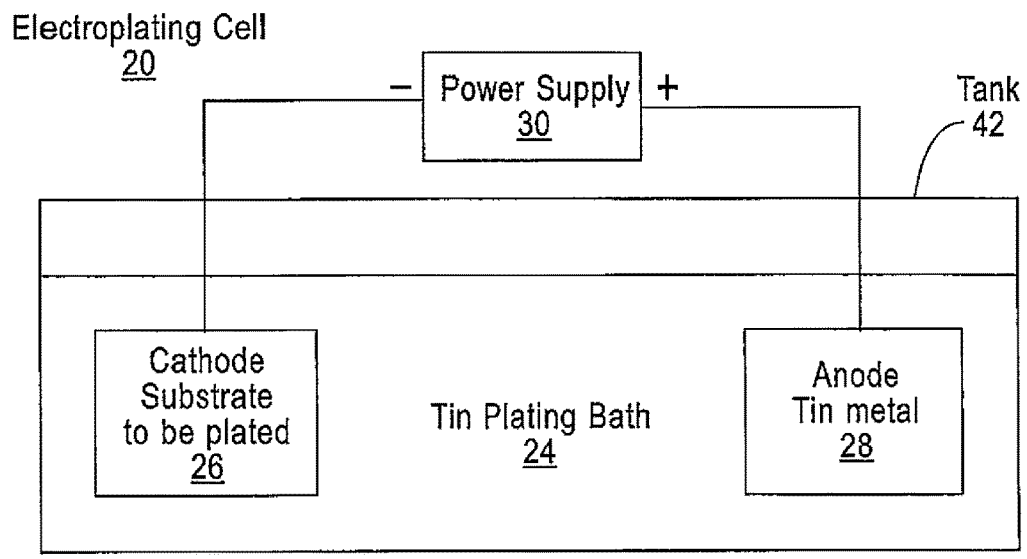
FIG. 2 shows one example of a conventional electroplating cell.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The embodiments of this invention will be described below primarily in the context of a substrate that contains at least one recessed feature such as a void or an opening or a trench in a surface of the substrate. However, the embodiments of this invention apply as well to a substrate having a raised feature disposed on the surface. Furthermore, in some use-cases of interest a given substrate could include at least one recessed feature and at least one raised feature on the surface.

The embodiments of this invention provide a method to selectively deposit solder plating onto a predefined plating area without requiring the use of a layer of photoresist during the solder plating operation. The use of the embodiments of this invention can be especially beneficial when there are pre-existing structures and/or pre-existing apertures or voids (e.g., deep trenches) on and in the surface of a semiconductor wafer, where the presence of such structures and/or voids would interfere with an ability to deposit and pattern photoresist to define regions where a selected solder material would be deposited.

Reference can be made to FIGS. 1A, 1B and 1C, collectively referred to as FIG. 1, for showing enlarged views of an exemplary structure of interest to the embodiments of this invention. FIG. 1A is a top view of the structure, FIG. 1B is a cross-sectional view taken along the section line labeled 1B-1B in FIG. 1A, and FIG. 1C is a further enlarged view of a portion of the structure shown in FIG. 1B. The structure is comprised of a substrate 10, e.g., a Silicon (Si) substrate, having a metal layer 12, e.g., a Titanium (Ti) layer, a Tantalum (Ta) layer, or a Titanium Tungsten alloy (TiW) layer, disposed on a top surface thereof. A metal structure also referred to herein as a metal feature, such as a ring 16, e.g., a Copper (Cu) ring, is disposed on the Ti layer 12. Enclosed within an area defined by the ring 16 is an aperture or recess 14 formed through the Ti layer 12 and partially into the Si substrate 10. As non-limiting dimensional examples the recess 14 could have a diameter in a range of about 200 μm to about 500 μm and a depth of about 100 μm (or deeper), the Ti layer 12 could have a thickness in a range of about 30 nm to about 60 nm, and the Cu ring 16 could have a height and a width that is less than about 10 μm, for example in a range of about 1 μm to about 2 μm. The spacing (Sp) between an inner edge of the Cu ring 16 and the outer edge of the recess 14 could be, for example, about 10 μm or less.

The Cu feature 16 could have a shape other than circular, such as an ovoid or a square or a rectangular shape, or a hexagonal shape, or any desired regular or irregular shape. The circular shape is shown simply for convenience. Likewise the recess 14 could have other than the circular top opening shape as shown, and in some embodiments the recess 14 could have other than the vertical sidewalls that are illustrated.

FIG. 1C shows a portion of the structure, i.e., a portion of the Si substrate 10, Ti layer 12 and metal (Cu) ring 16 on the left side of the view of FIG. 1B, after performing a plating operation to selectively form a solder plating layer 18 on the surface of the Cu ring 16 and not on the surface of the surrounding Ti layer 12. The solder plating layer 18 can then be used to solder bond a cover (e.g., a solder, gold, or other type of solder wettable metal-containing cover) over the recess 14 so as to seal (e.g., hermetically seal) the recess 14 from the ambient. In an exemplary end-use of the structure the recess 14 could contain any desired type of device or devices, such as one or more sensors, actuators, energy storage devices and/or micro-electro-mechanical systems (MEMS). The selected device or devices disposed within the recess 14 can be electrically contacted via the Si substrate 10.

In conventional practice the solder plating operation may have involved depositing a dielectric layer (e.g. a layer of photoresist) over the structure followed by a photolithographic patterning operation to define and etch a circular trench in the dielectric layer so as to expose the top surface of the Cu ring 16. Next the desired solder plating material could be blanket deposited over the patterned photoresist layer so as to also cover the top surface of the Cu ring 16, followed by resist liftoff and cleaning. As can be appreciated this approach would involve a time-consuming multi-step deposition and liftoff process that would be complicated by the presence of the recess 14 in close proximity to the Cu ring 16. As was noted above the spacing (Sp) between the ring 16 and the edge of the recess 14 may be only about 10 μm, making it difficult to pattern the photoresist layer so close to the recess 14.

In accordance with aspects of this invention the solder plating operation is performed without requiring the deposition and patterning of a photoresist layer. Instead the solder plating operation is performed using a multi-electrode electroplating cell with a selected solder or solder alloy and plating bath.

As a point of reference FIG. 2 shows one example of a conventional electroplating cell 20. In this example, the cell 20 includes a tank 22 that contains a tin plating bath 24. Immersed in the bath 24 is a cathode 26, i.e., a substrate to be plated, and an anode 28, e.g., tin metal. The cathode 26 and the anode 28 are connected to a power supply 30. In an example the anode 28 is the metal to be plated on the cathode 26 (e.g., Tin) or an insoluble anode (e.g., platinized Titanium or Iridium oxide coated Titanium). On the cathode 26 reduction takes place:

$$M^{n+} + ne^- \rightarrow M$$

$$2H^+ + 2e^- \rightarrow H_2.$$

On the anode 28 oxidation takes place:

$$M \rightarrow M^{n+} + ne^-$$

$$2H_2O \rightarrow 4H^+ + O_2 + 4e^-.$$

Figure 3:
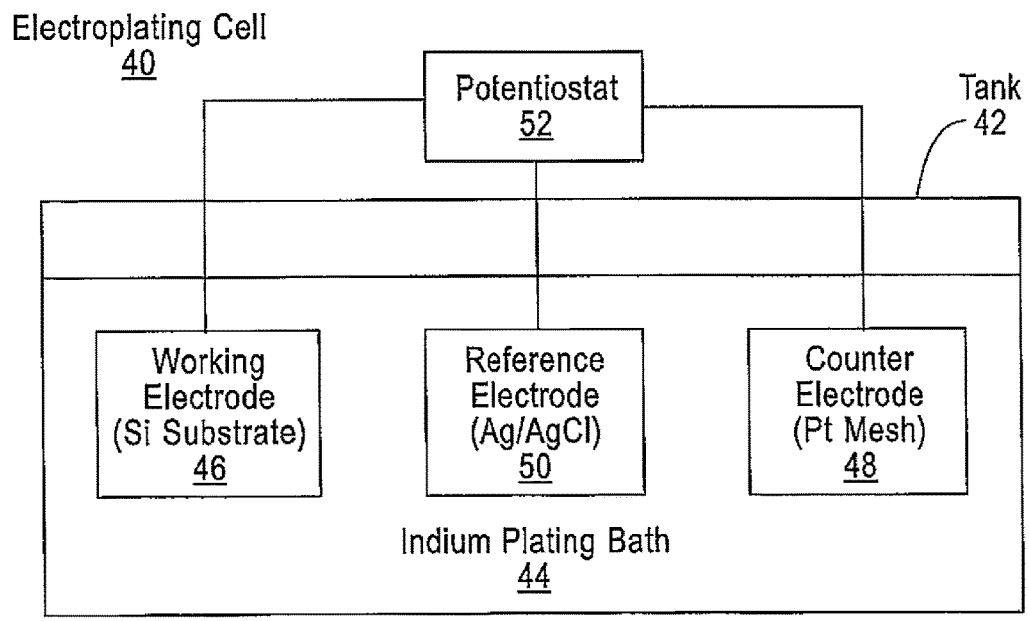
FIG. 3 depicts a non-limiting example of a three electrode electroplating cell that can be used to selectively plate solder on a patterned substrate in accordance with embodiments of this invention.

FIG. 3 shows a more preferred example of an electroplating cell that can be used in accordance with embodiments of this invention to selectively deposit the solder plating layer 18 (e.g., a layer of Indium) only on the Cu ring 16 as in FIG. 1, and not on the Ti layer 12. More specifically, FIG. 3 depicts a non-limiting example of a three electrode electroplating cell 40 that can be used to plate Indium solder on the patterned silicon wafer 10. In the illustrated embodiment a tank 42 contains an Indium plating bath 44. Immersed in the bath 44 is a working electrode 46, a counter electrode 48 and a reference electrode 50. The three electrodes are connected to the power supply via a potentiostat 52. The potentiostat 52 functions by maintaining the potential of the working electrode 46 at a desired constant level with respect to the reference electrode 50 and passing the current at the counter electrode 48. In the illustrated exemplary embodiment the working electrode 46 is the Si wafer 10 having the Cu ring 16 that is to be plated (as in FIGS. 1A and 1B), the reference electrode 50 can be comprised of Ag/AgCl in 3M KCl, and the counter electrode 48 can be comprised of a Pt mesh.

On the working electrode 46 reduction takes place as follows:

$$In^{3+} + 3e^- \rightarrow In$$

$$2H^+ + 2e^- \rightarrow H_2.$$

On the counter electrode 48 oxidation takes place as follows:

$$2H_2O \rightarrow 4H^+ + O_2 + 4e^-.$$

In the presently preferred embodiments of this invention the solder plating takes place under constant potential control. The reference electrode 50, via the potentiostat 52, maintains a constant electrical potential between the working electrode 46 and the reference electrode 50, and current flows between the counter electrode 48 and the working electrode 46.

Non-limiting examples of solder and solder alloys that can be used in accordance with embodiments of this invention include, in addition to Indium: Tin, Tin-Silver, Tin-Silver-Copper, Indium-Tin, Tin-Lead, Tin-Bismuth and Tin-Gold. When using one of the exemplary solders and solder alloys other than Indium the composition of the plating bath 44 is adjusted accordingly.

When Indium is used as the solder plating material, non-limiting examples of the composition of the Indium plating bath 44 that can be used in accordance with embodiments of this invention include: a source of Indium metal such as but not limited to Indium Sulfate, Indium Chloride, Indium Methanesulfonate, Indium Acetate or Indium oxide. The Indium plating bath 44 also includes a conductivity salt or acid such as, but not limited to, Sulfuric acid, Hydrochloric acid, Methane Sulfonic acid or Sulfamic acid. The Indium plating bath 44 also preferably includes a wetting agent or grain refiner such as, but not limited to, about 0.01% to about 2% of organic molecules such as a surfactant.

Figure 4:
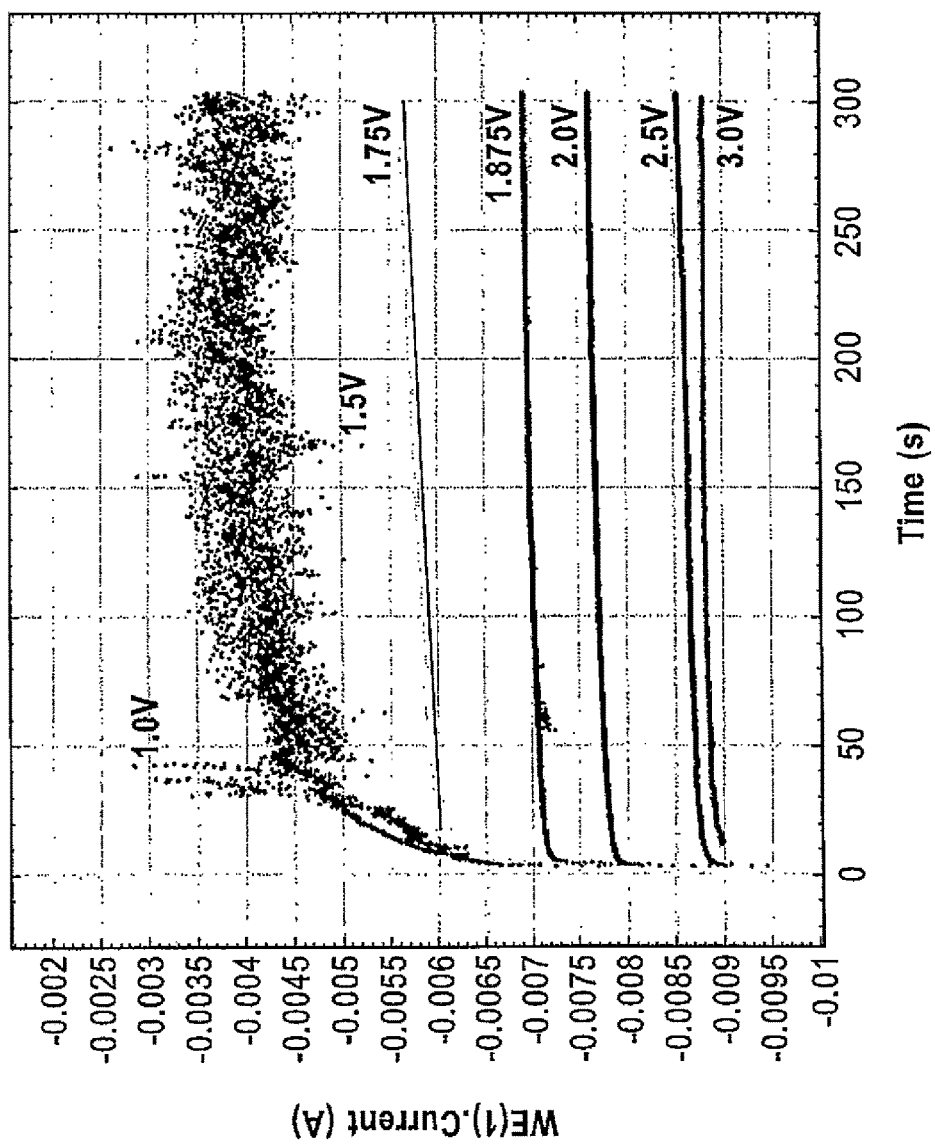
FIG. 4 is a graph depicting amperometry plots of Indium plating on Cu/Ti using the electroplating cell of FIG. 3.

Using the electroplating cell 40 of FIG. 3 the following was observed for an electroplating condition of 1V vs. the Ag/AgCl reference electrode 50, 2V vs. the Ag/AgCl reference electrode 50 and 3V vs. the Ag/AgCl reference electrode 50. Reference can also be made to the amperometry plots in FIG. 4 (obtained from detection of ions in solution based on electric current or changes in electric current) of Indium plating on Cu/Ti.

For the 1V vs. the Ag/AgCl reference electrode 50 condition the result was that selective Indium plating was achieved on the Cu ring 16 and not on the surrounding surface of the metal layer 12. The Indium deposit 18 was smooth, but the deposition rate was low, i.e., less than 0.1 μm/min.

For the 2V vs. the Ag/AgCl reference electrode 50 condition the result was that selective Indium plating was achieved on the Cu ring 16 and not on the surrounding surface of the metal layer 12. The Indium deposit 18 was smooth, and the deposition rate was 0.8 μm/min, i.e., a 4 μm thickness Indium deposit was achieved in 5 min.

For the 3V vs. the Ag/AgCl reference electrode 50 condition the result was that no selective Indium plating was achieved. Instead it was observed that the Indium plated on both the surface of the Cu ring 16 and on the surface of the Ti layer 12. The Indium deposit 18 was found to be rough and not smooth, and the deposition rate was very low, less than 0.1 μm/min.

That is, the selective Indium plating on the Cu ring 16 over the Ti layer 12 was found to occur in a range from about 1.0V to about 2.0V, and the deposited Indium layer (solder plating layer 18) was observed to be visually smooth. A more optimum voltage potential range to achieve the smooth selective Indium plating on the Cu ring 16 was found to be in a range of about 1.875V to about 2.0V. However, at voltage potentials greater than about 2.0 V the Indium was found to (slowly) plate on both the Cu ring 16 and on the Ti layer 12, and the deposited Indium layer was observed to be visually rough and not smooth.

The embodiments of this invention provide a method and structure for selectively plating a solder material onto a metal structure disposed over a metal layer on a surface of a substrate using a voltage controlled three electrode plating cell. Although there is one metal feature shown in the drawings, i.e., one Cu ring 16, in practice there could be many such features present and all can be simultaneously plated with the desired solder material during immersion in the bath 44. Furthermore, for those embodiments where the recess or some other substrate structure is present it need not be enclosed within and surrounded by the metal feature 16 as shown in FIG. 1.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to, the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent plating materials, metal-containing substrates to be plated, plating solutions, electrode materials and voltage potentials may be used by those skilled in the art. However, all such and similar modifications of the teachings of this invention will still fall within the scope of this invention.

What is claimed is:

1. A method, comprising:

providing a structure comprised of a substrate having a metal layer disposed on a surface and a metal feature disposed on the metal layer, wherein the metal layer is comprised of titanium and the metal feature is comprised of copper;

immersing the structure in a plating bath contained in an electroplating cell, the plating bath comprising an indium salt;

applying a constant voltage potential to the structure, where the structure functions as a working electrode in combination with a reference electrode and a counter electrode that are also immersed in the plating bath;

maintaining the constant voltage potential at a predetermined value; and depositing, under the constant voltage potential, a solder material comprising a layer of indium, from the indium salt, selectively only on the metal feature without the use of a resist.

2. The method as in claim 1, wherein the indium salt of the plating bath is one or more of indium sulfate, indium chloride, indium methanesulfonate, indium acetate, and indium oxide and wherein the plating bath is further comprised of a conductivity salt or acid comprised of one of sulfuric acid, hydrochloric acid, methane sulfonic acid or sulfamic acid.

3. The method as in claim 2, wherein the plating bath is further comprised of a wetting agent.

4. The method as in claim 1, wherein the predetermined value of the constant voltage potential is in a range of about 1V to about 2V.

5. The method as in claim 1, wherein the predetermined value of the constant voltage potential is in a range of about 1.875V to about 2V.

6. The method as in claim 1, wherein the reference electrode is comprised of Ag/AgCl in 3M KCl, and wherein the counter electrode is comprised of a Pt mesh.

7. The method as in claim 1, wherein the substrate comprises a recess made in a surface thereof, wherein the metal feature has a substantially circular ring shape, and wherein the recess is disposed within a circumference of the metal feature.

* * * * *